United States Patent
Miyahara (10) Patent No.: US 6,915,676 B2
(45) Date of Patent: Jul. 12, 2005

(54) METHOD OF FORMING A PROTRUDED SHAFT FOR AN ELECTRONIC MEMORY DEVICE

(75) Inventor: Hideyuki Miyahara, Nagano (JP)

(73) Assignee: Nakamura Seisakusho Kabushikigaisha, Nagano-ken (JP)

( * ) Notice: Subject to any disclaimer, the term of this patent is extended or adjusted under 35 U.S.C. 154(b) by 0 days.

(21) Appl. No.: 10/314,493

(22) Filed: Dec. 9, 2002

(65) Prior Publication Data

US 2003/0110824 A1 Jun. 19, 2003

(51) Int. Cl.⁷ .............................................. B21C 37/02
(52) U.S. Cl. ........................ 72/379.2; 72/356; 72/325
(58) Field of Search .............................. 72/379.2, 356, 72/358, 325, 359, 377

(56) References Cited

U.S. PATENT DOCUMENTS

| | | | | |
|---|---|---|---|---|
| 1,048,046 A | * | 12/1912 | Currey | 72/334 |
| 1,744,810 A | * | 1/1930 | Shallcross | 219/107 |
| 2,610,390 A | * | 9/1952 | Locke | 29/874 |
| 3,276,112 A | * | 10/1966 | Tantlinger | 29/432 |
| 3,387,481 A | * | 6/1968 | Harvey | 72/256 |
| 4,928,375 A | * | 5/1990 | Hadaway | 29/509 |
| 5,273,385 A | * | 12/1993 | Rose et al. | 411/501 |
| 5,642,641 A | * | 7/1997 | Maxfield et al. | 72/358 |
| 5,921,131 A | * | 7/1999 | Stange | 72/379.2 |
| 6,006,579 A | * | 12/1999 | Iseri et al. | 72/379.2 |

FOREIGN PATENT DOCUMENTS

| | | | | |
|---|---|---|---|---|
| DE | 725881 | * | 10/1942 | 72/359 |
| GB | 1596771 | * | 8/1981 | 72/357 |
| JP | 58-47518 | * | 3/1983 | 72/350 |
| JP | 59-50922 | * | 3/1984 | 72/253.1 |
| JP | 61-169126 | * | 7/1986 | 72/377 |

* cited by examiner

Primary Examiner—Daniel C. Crane
(74) Attorney, Agent, or Firm—Flynn, Thiel, Boutell & Tanis, P.C.

(57) ABSTRACT

In a method of forming a protruded shaft on a metal base for an electronic memory device, the metal base is pressed down with a pressing tool from upper face side of the metal base placed on a die. The die is provided with a hole having a predetermined inner diameter and the wall material of the metal base is moved into the hole of the die to form a protruded shaft having a hollow part inside and the tip end closed.

3 Claims, 5 Drawing Sheets

METHOD OF FORMING A PROTRUDED SHAFT FOR AN ELECTRONIC MEMORY DEVICE

BACKGROUND OF THE INVENTION

1. Technical Field of the Invention

The present invention relates to an electronic memory device, for example, a magnetic memory device such as a hard disk drive device and the like, or an optical memory device such as a compact disk drive device and the like. More particularly, the present invention relates to a method of forming a protruded shaft which is used for installing various components or supporting rotational members or the like on a metal base of the electronic memory device.

2. Description of Related Art

A conventional electronic memory device, e.g., a hard disk drive (referred to as HDD) device is shown in FIG. 8(A). The HDD device is comprised of an approximately dish-shaped base 100 made of a metal plate and various kinds of members equipped in a recessed portion of the base 100 having an open upper face. The open upper face of the base 100 is covered with a plate-shaped top cover 101 and, as a whole, the electronic memory device is constituted of a roughly card shape.

Furthermore, the recessed portion of the base 100 is equipped with a magnetic disk as an information recording medium and various mechanisms such as a spindle motor for supporting and rotating the magnetic disk, a plurality of magnetic heads for writing or reading information from the magnetic disk, a head actuator 102 for movably supporting the magnetic heads with respect to the magnetic disk, a voice coil motor for swinging and positioning the head actuator, and a circuit board unit.

On activation of the voice coil motor, the head actuator 102 swings between an operating position on the magnetic disk and a retreated position. A stopper pin 103 formed of a protruded shaft is arranged on the base 100 to prevent an excess of swing movement over the retreated position.

A seal 104 made of rubber or the like is sandwiched between the edge portions of the base 100 and the top cover 101 so that the interior of the HDD device can be kept in an airtight condition. That is, the seal rubber is tightly interposed between the edge portions in the vertical direction so that the interior of the base 100 is protected from entering dust from the outside. This is because the contamination such as minute dust suspended in the outside air or the harmful ion causes the error due to attaching on the surface of the magnetic disk.

In the conventional HDD device, the stopper pin 103 is formed as shown in FIGS. 8(A) or 8(B). A stopper pin 103 in FIG. 8(A) is integrally protruded inside of the base 100 made of a metal plate. The metal base 100 is placed on a die (not illustrated) provided with a hole having a predetermined inner diameter and performed a burring processing from the back side of the base 100 to form the protruded cylindrical-shaped stopper pin 103 which is formed a through hole. A stopper pin 103 shown in FIG. 8(B) is constituted in such a manner that a through hole is formed in the base 100 and the stopper pin 103 made of a shaft member is separately fitted into the through hole. Then the stopper pin 103 is crimped to the base 100. The stopper pin may be fixed to the base by a screw.

As described above, the conventional stopper pin 103 is formed of a cylinder, which is penetrated in the vertical direction as shown in FIG. 8(A). Therefore, the interior of the HDD device communicates with the outside. As a result, there may be a problem that foreign particles called contaminant such as minute dust or harmful ion enter into the interior of the HDD device from the outside and causes an error due to the attaching of the particles to the surface of the magnetic disk. In order to prevent the above problem, it has been known a means for sealing the interior of the HDD device from the outside with a sealant 105 inserted into the hollow part of the stopper pin 103. It has been also known a means for sealing the interior from the outside with a sealing tape stuck to the bottom surface of the base 100. However, the means of inserting the sealant 105 generates a harmful gas from the sealant 105 and it may cause the surface of the magnetic disk to change in quality.

Moreover, according to the method of crimping the stopper pin 103 to the base 100, there may be a problem that a required strength can not be obtained since the thickness of the base 100 becomes thinner as the height of the HDD device has been reduced. Another method is that a through hole is formed in the base 100 and then a stopper pin 103 is fixed to the through hole by a screw. However, this method increases necessary parts and working steps and thus inevitably results in the increase of manufacturing cost.

SUMMARY OF THE INVENTION

In view of the above, it is an object of the present invention to provide a method of forming a protruded shaft for an electronic memory device which is capable of closing the tip end of the protruded shaft and having a required strength simply and easily even when a base is a thin plate.

In order to achieve the object, a method of forming a protruded shaft for an electronic memory device in accordance with an embodiment of the present invention is comprising a step of pressing the metal base by a pressing tool from one face side of the metal base placed on a die that is provided with a hole having a predetermined inner diameter to move the wall material of the metal base into the hole of the die and to form a protruded shaft having a hollow part inside and the tip end closed.

According to the method of forming the protruded shaft, the wall material of the metal base is moved into the hole of the die by the pressing of the pressing tool. Thus, the protruded shaft in which a hollow part is formed inside and the tip end is closed is formed simply and inexpensively. Further, the tip end of the protruded shaft can be formed closed so that there may be no damage of air tightness even when the shaft is used in an electronic memory device. The protruded shaft is integrally formed on the metal base and therefore can be formed with a required strength even when the base is a thin plate.

Preferably, in the method of forming the protruded shaft according to an embodiment of the present invention, a taper-shaped pressing tool is suitably used wherein a taper part having a diameter tapering off to the tip end and its tip face is shaped as an acute angle, an approximately flat or an approximately sphere. In this configuration, the wall material of the base is moved into the hole of the die, a substantially drill-shaped hollow part symmetrical to the taper part is formed inside the protruded shaft and the tip end of the protruded shaft is closed.

Preferably, in the method of forming a protruded shaft, first a flat pressing tool is used to from one face of the metal base placed on a die to form a recessed part and to move the wall material of the metal base into the hole of the die. The tip face of the flat pressing tool may be formed of a flat or approximately sphere surface. Then, another pressing tool is used for forming a protruded shaft wherein the outer diameter of the pressing tool is smaller than the inner diameter of the hole of the die. The another pressing tool moves the wall material of the metal base into the hole of the die for further extending the length of the protruded shaft.

Preferably, one face of the metal base placed on the die is firstly pressed by a taper-shaped pressing tool to move the wall material of the base into the hole of the die and to form a protruded part and a hollow part inside the protruded part. Secondly a flat pressing tool is used to form a recessed part on the one face of the base to make the wall material further move into the hole of the die in order to extend the protruded part. The tip face of the flat pressing tool may be formed in a flat or an approximately sphere surface. After that, an extending tool is used to press the recessed part to further move the wall material into the hole of the die and extend the protruded part for forming a protruded shaft.

DETAILED DESCRIPTION OF THE PREFERRED EMBODIMENTS

Methods of forming a protruded shaft for an electronic memory device according to various embodiments of the present invention will be described in detail with reference to the accompanying drawings.

Figure 2:
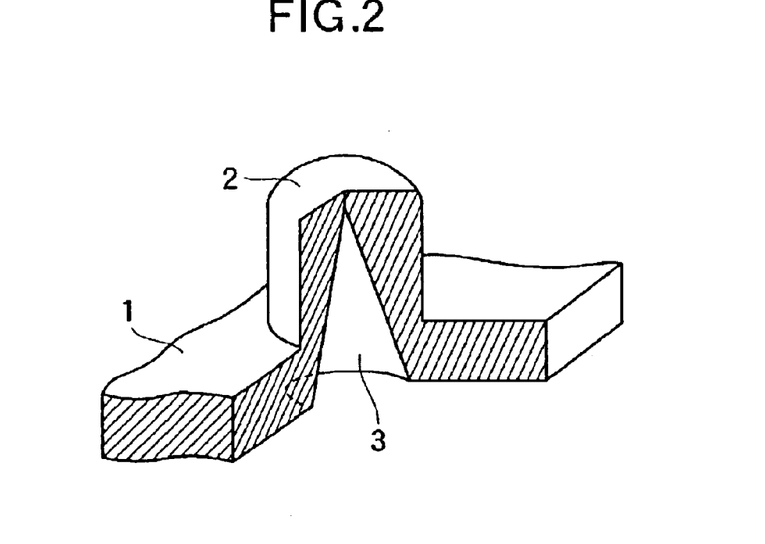
FIG. 2 is a partially cross sectional perspective view showing a base that is formed a protruded shaft according to an embodiment of the present invention.

FIG. 2 is a partially cross sectional perspective view which shows a protruded shaft 2 that is formed by a method of forming a protruded shaft for an electronic memory device according to an embodiment of the present invention. A base 1 is a metal plate suitable for plastic working such as iron, stainless steel or aluminum that has strength required as the base. The base 1 is worked with a plastic deformation to integrally form a protruded shaft 2 for supporting or positioning of a mechanism in the electronic memory device. The protruded shaft 2 is formed by a method explained later in detail.

A conical-shaped hollow part 3 is formed inside the protruded shaft 2 as shown in FIG. 2. The hollow part 3 is formed by deforming and moving a wall material of the base 1 to the tip side of the protruded shaft 2 in order to extend a shaft length of the protruded shaft 2 when the base 1 is worked with the plastic deformation. A plurality of protruded shafts 2 may be provided on the base 1 depending on the purposes such as supporting or positioning mechanisms. The hollow part 3 is preferably formed in a cone shape for an approximately column-shaped protruded shaft 2, but it may be formed in a generally polygonal shape such as quadrangle, triangle or the like.

Figure 3:
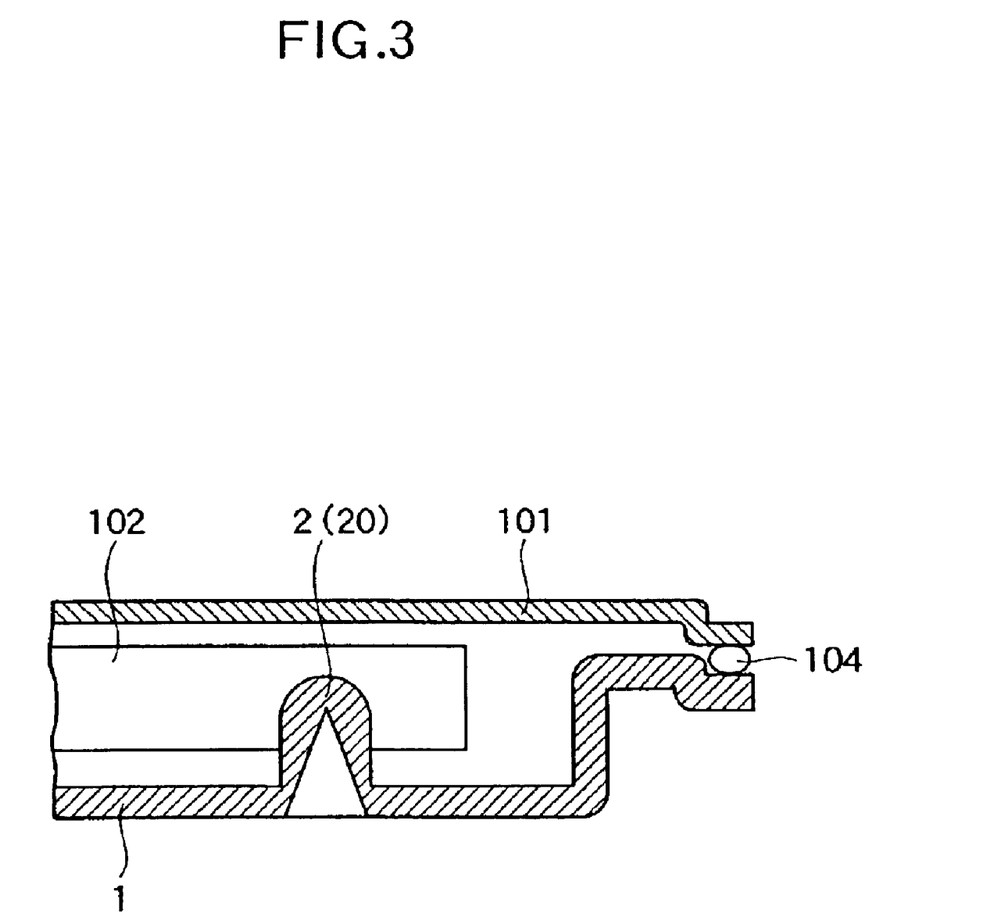
FIG. 3 is a cross sectional view which partially shows an electronic memory device, which is formed a protruded shaft according to an embodiment of the present invention.
Figure 8:
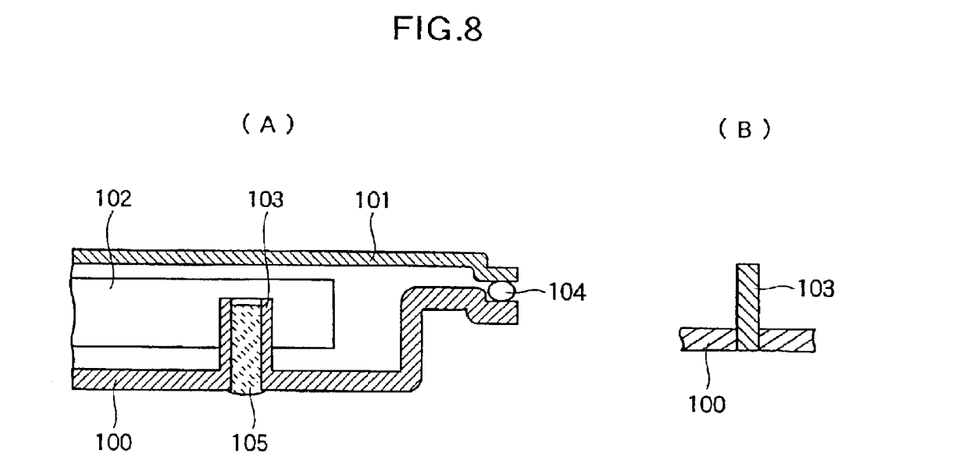
FIG. 8(A) is a cross sectional view which partially shows an electronic memory device having a conventional protrusion shaft.
FIG. 8(B) is a cross sectional view showing another conventional stopper pin.

FIG. 3 is a cross sectional view which partially shows a HDD device as an example of an electronic memory device in which a protruded shaft 2 is formed in the base 1. The reference numbers in FIG. 3 that are the same in FIG. 8 show the same configuration and thus the description is omitted. In FIG. 3, the protruded shaft 2 is illustrated as a stopper pin 20. As described above, by conducting an electric current through a voice coil motor, a head actuator 102 swings in an area between an operating position and a retreated position on a magnetic disk. The stopper pin 20 composed of the protruded shaft 2 is integrally arranged on the base 1 to prevent the head actuator 102 from excess swinging beyond the retreated position.

Figure 1:
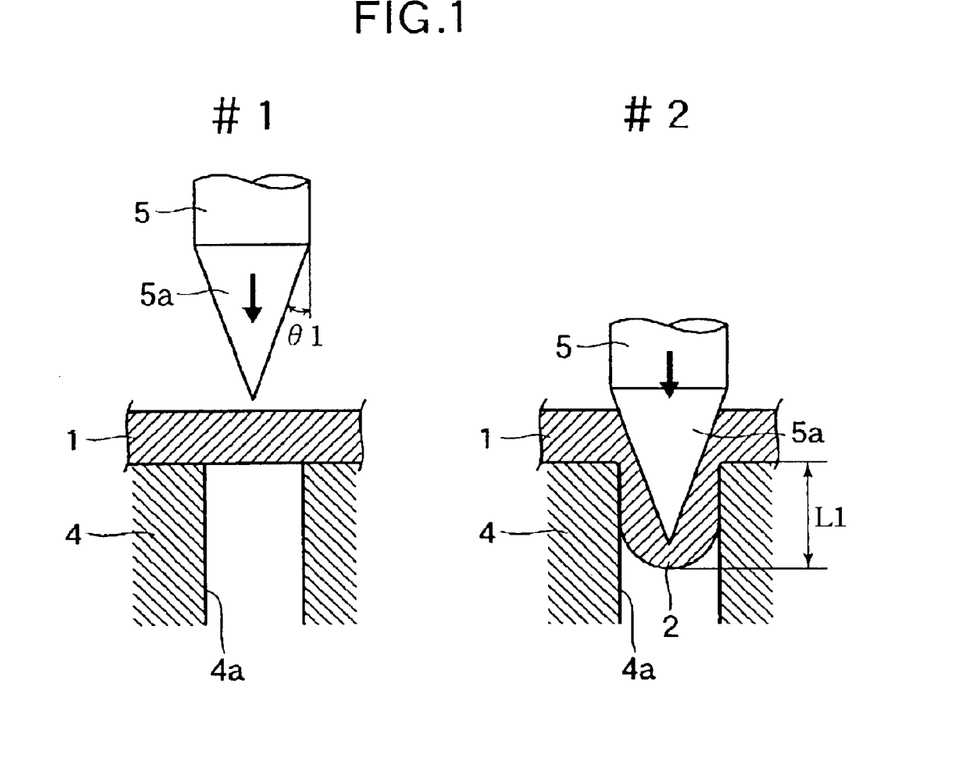
FIG. 1 is a step view which shows a method of forming a protruded shaft for an electronic memory device according to an embodiment of the present invention.

Next, a method of forming a protruded shaft for an electronic memory device according to an embodiment of the present invention is described in detail in FIG. 1. FIG. 1 shows steps of forming a protruded shaft 2. In a first step #1, the base 1 made of a metal plate such as iron, stainless steel, or aluminum is positioned and placed on an upper surface of a die 4. The die 4 is provided with a hole 4a having a predetermined inner diameter, which is the corresponding dimension required to form the protruded shaft 2. Next, in a protruded shaft forming step #2, the base 1 placed on the die 4 is pressed downward from one face side by a pressing tool 5 to integrally form the protruded shaft 2 on the other side in such a manner that its tip end is closed.

The pressing tool 5 used in the protruded shaft forming step #2 has a column-shaped base portion and a taper part 5a on the tip side which is tapered off to the tip end and of an approximately drill-shape with an acute angle. The taper-shaped pressing tool 5 is moved down concentrically with the hole 4a of the die 4 to press the base 1 by the taper part 5a from one side. Consequently, the wall material of the base 1 is deformed and moved into the hole 4a of the die 4 in the down direction and then the protruded shaft 2 having a shaft length L1 is formed within the hole 4a. At that time, since the taper-shaped pressing tool 5 is stopped before it reaches to the tip surface of the protruded shaft 2 as shown in the figure, the tip end of the protruded shaft 2 is formed closed. A conical hollow part 3, which is similar to the taper part 5a of the pressing tool 5, is formed inside the protruded shaft 2. Then, the base 1 is separated from the die 4.

The depth of the taper portion 5a of the taper-shaped pressing tool 5 pressed down is so set that there is a suitable distance between the opening edge of the hole 4a of the die 4 and the periphery face of the taper part 5a as shown in the figure. Thus, the stem part of the protruded shaft 2 has a suitable thickness at the opening edge of the hollow part 3 so as to obtain a required strength.

As described above, when the protruded shaft 2 is formed by the pressing tool 5 having the taper part 5a, the taper part 5a reaches to a deep position in the hole 4a of the die 4. Thus, the wall material of the base 1 can be moved deeper in the hole 4a so that a relatively longer protruded shaft 2 can be formed simply and easily. Since the tip end of the protruded shaft 2 is closed, the interior formed between the base and the top cover can be kept in an airtight state. Further, since the protruded shaft 2 is integrally formed in the base 1, a necessary and sufficient mechanical strength and a highly precise perpendicularity can be obtained. Thus, the accuracy of supporting, positioning or the like for mechanisms is improved and a mechanical accuracy required as an electronic memory device can be easily attained.

A metal plate such as iron, stainless steel, or aluminum used as the base 1 is suitable for plastic working but its ductility is different respectively. When a metal plate of which the ductility is small and a taper-shaped pressing tool 5 having the taper part 5a with a taper angle θ1 are used as shown in FIG. 1, the shaft length becomes short because the wall material will not be moved much due to the low ductility. Also, there may be happened that the taper-shaped pressing tool 5 breaks through the tip end of the protruded shaft 2 and the tip end is not closed. For this case, as shown in FIG. 4(A), it is desirable to employ a pressing tool 15 having a taper part 15a with a larger taper angle θ2.

Figure 4:
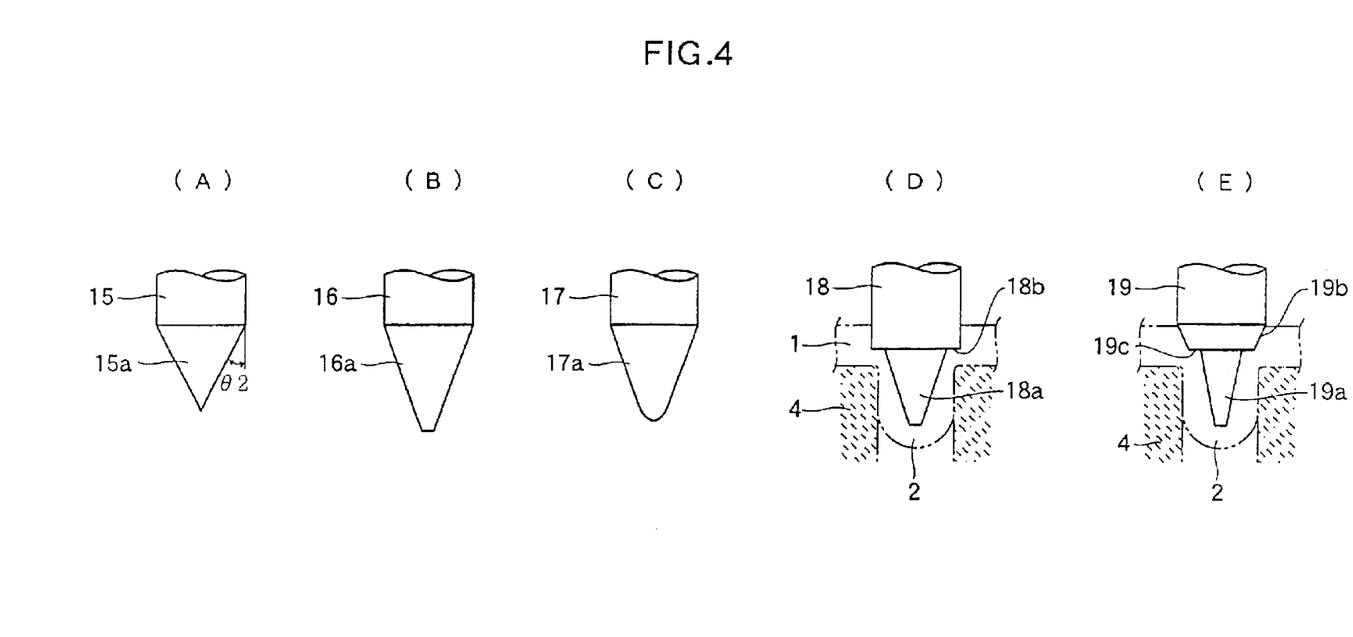
FIGS. 4(A), 4(B), 4(C), 4(D) and 4(E) are front views respectively showing modified examples of a pressing tool.

When the ductility of a metal plate is comparatively small, it is desirable to employ a taper-shaped pressing tool 16 of which the tip face of a taper part 16a is formed a flat-shape as shown in FIG. 4(B) or a taper-shaped pressing tool 17 of which the tip face of a taper part 17a is formed in an approximately sphere-shape as shown in FIG. 4(C). The amount and distance of the moved and deformed material of the metal plate can be increased without breaking through the tip end of the protruded shaft 2 by providing the tip face of the pressing tool with a flat-shape or an approximately sphere-shape. Therefore, a relatively longer protruded shaft 2 can be formed with the tip end of the protruded shaft 2 completely closed.

Furthermore, as shown in FIG. 4(D), a pressing tool 18 may be provided with a circular step part 18b on the tip side and an approximately drill-shaped taper part 18a having a diameter tapering off from the step part 18b to the tip end. As a modified example, the tip side of a pressing tool 19 may be provided with a circular shaped step part 19b, an approximately drill-shaped taper part 19a and a truncated-conical part 19c between the cylindrical part and the step part 19b as shown in FIG. 4(E). When the tip side of the pressing tool is formed with a step part 18b or 19b, since the step part 18b or 19b presses the upper surface of the base 1 in an extending direction of the protruded shaft 2 so that the wall material is moved smoothly and the protruded shaft 2 is formed easily. As a result, the length of the protruded shaft 2 can be made longer.

The taper part of the pressing tool 5 is not always formed like a straight shape. The taper part 18a can be shaped in an approximately parabolic shape. Moreover, the taper-shaped pressing tool is not limited in a cylindrical shape but it may be formed in a non-circular shape such as a polygonal shape.

Figure 5:
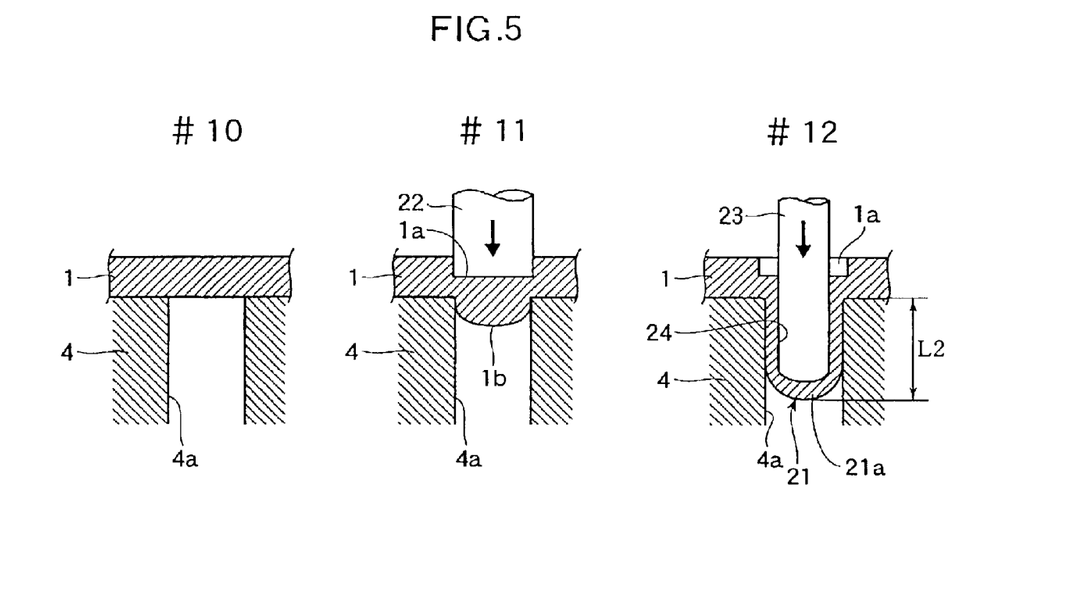
FIG. 5 is a step view which shows another method of forming a protruded shaft according to another embodiment of the present invention.

FIG. 5 shows another method of forming a protruded shaft for an electronic memory device according to another embodiment of the present invention, which is capable of increasing a shaft length. In a first step #10, a base 1 made of a metal plate such as iron, stainless steel, or aluminum is placed on the upper surface of the die 4 as shown in FIG. 1. The die 4 is formed with a hole 4a having a predetermined inner diameter, which is able to make a required outer diameter of a protruded shaft 21.

Next, in a pressing step #11, a flat pressing tool 22 with the tip end shaped flat is pressed down from one face side of the base 1 placed on the die 4. A recessed part 1a, which is shallower than the thickness of the base 1, is formed in the one face of the base 1 by the pressing. At the same time, the wall material of the recessed part 1a is moved within the hole 4a of the die 4 so that a protruded part 1b with a short length is formed within the inside of the hole 4a. The tip face of the flat pressing tool 22 may be formed in an approximately sphere-shape with a large radius of curvature.

In a protruded shaft forming step #12, as previously described in the step #2, a cylindrical pressing tool 23 is pressed down from one face side of the base 1 placed on the die 4 and then a protruded shaft 21 is formed on the other face side. The pressing tool 23 employed in the step #12 for forming a protruded shaft is formed in a cylindrical shape having substantially the same diameter from the stem to the tip side and a tip end part formed like an approximately hemisphere shape. The pressing tool 23 is moved down concentrically with the hole 4a of the die 4 and the tip end of the pressing tool 23 presses the recessed part 1a formed on the one face of the base 1. By the pressing, the protruded part 1b formed within the inside of the hole 4a is further extended into the hole 4a of the die 4 in a deeper direction. As a result, a protruded shaft 21 having a shaft length L2 is formed within the hole 4a. The shaft length L2 is further longer than the protruded shaft 2, which is formed by the method shown in FIG. 1.

A substantially cylindrical hollow part 24 that is approximately the same shape as the pressing tool 23 is formed in the inside of the protruded shaft 21. The difference between the outer diameter of the pressing tool 23 and the inner diameter of the hole 4a in the die 4 forms a wall thickness of the protruded shaft 21 for assuring a required strength. A bottom face part 21a is closed at the tip end of the protruded shaft 21.

When the inner diameter of the recessed part 1a formed in the base 1 is made larger than the outer dimension of the pressing tool 23, the amount of the wall material of the base 1 moved into the inside of the hole 4a of the die 4 is increased. As a result, in the case that the column-shaped pressing tool 23 is pressed down from one face side of the base 1, the increased amount of the wall material is moved into the hole 4a of the die 4 in the deeper direction and the protruded shaft 21 can be further extended. Accordingly, the axial length of the protruded shaft 21 formed inside of the hole 4a can be made longer.

When the inner diameter of the recessed part 1a formed on the base 1 is set to be the same as the outer dimension of the pressing tool 23, no recessed part 1a can be left after the protruded shaft 21 is formed by the column-shaped pressing tool 23.

As descried above, in the pressing step #11, a wall material of the plate 1 is moved into the inside of the hole 4a of the die 4 by a flat pressing tool 22 and a protruded part 1b is formed in advance and then the protruded shaft 21 is formed by the column-shaped pressing tool 23. Accordingly, the wall material of the protruded part 1b can be moved into the further deeper portion of the hole 4a by the pressing tool 23 so that the protruded shaft 21 with a long shaft length can be formed simply and easily. The tip part of the protruded shaft 21 is closed by the bottom face part 21a. Thus, the interior formed by the base and the top cover can be kept in an airtight condition. Since the protruded shaft 21 is integrally formed in the base 1, a mechanical strength and accuracy required as an electronic memory device can be easily obtained. Furthermore, the axial length of the protruded shaft 21 can be made longer so that the protruded shaft 21 can be used as a shaft for supporting rotating bodies or the like.

Figure 6:
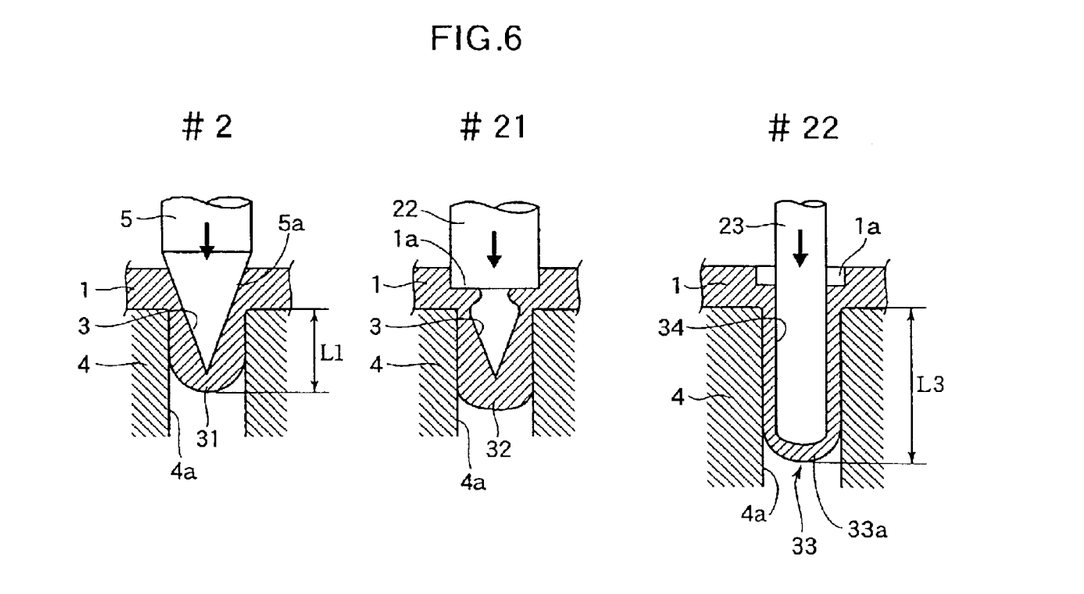
FIG. 6 is a step view which shows a further another method of forming a protruded shaft according to further another embodiment of the present invention.

FIG. 6 shows another method of forming a protruded shaft for an electronic memory device according to another embodiment of the present invention, which is capable of further extending a shaft length. First, as the first step #1 shown in FIG. 1, the base 1 made of a metal plate is positioned and placed on the upper surface of the die 4. Then, as the protruded shaft forming step #2 as shown in FIG. 1, the taper-shaped pressing tool 5 is pressed down concentrically with the hole 4a of the die 4 from one face side of the base 1. As a result, a protruded part 31 with an axial length L1 is formed inside the hole 4a of the die 4. A conical-shaped hollow part 3 similar as the taper part 5a of the pressing tool 5 is formed within the inside of the protruded part 31.

Then, in a pressing step #21 as the before-mentioned pressing step #11, the flat pressing tool 22 with the tip end shaped a flat face is pressed down from one face side of the base 1. By this pressing, a recessed part 1a that is shallower than the thickness of the base 1 is formed on one face side of the base 1. The base material of the recessed part 1a is moved into the hole 4a of the die 4 so that the protruded part 31 is extended to form the protruded part 32 having a further longer dimension within the hole 4a.

Next, in a protrusion shaft forming step #22 like the step #12 shown in FIG. 5, the cylindrical pressing and extending tool 23 is moved down concentrically with the hole 4a of the die 4 from the one face of the base 1. The bottom end of the pressing and extending tool 23 presses the recessed part 1a and the hollow part 3. By pressing the tool 23, the base material which is moved into the hole 4a is further extended to the inside of the hole 4a of the die 4 in the deeper direction so that the protrusion part 32 is made further longer. Accordingly, the protruded shaft 33 with a shaft length L3 is formed within the hole 4a and the shaft length L3 is made still further longer than the protruded shaft 21 formed by the method shown in FIG. 5.

A cylindrical hollow part 34 that is substantially the same shape as the pressing tool 23 is formed in the inside of the protruded shaft 33. The difference between the outer diameter of the pressing tool 23 and the inner diameter of the hole 4a in the die 4 becomes a wall thickness of the protruded shaft 33 to obtain the required strength. The closed bottom face part 33a is formed in the tip end of the protruded shaft 33.

The tip end of the protruded shaft 33 is formed closed and thus the interior formed by the base and the top cover can be kept in an airtight state. Moreover, since the protruded shaft 33 is integrally formed in the base 1, the mechanical strength and accuracy required as electronic memory devices are easily obtained. The shaft length of the protruded shaft 33 is made further longer so that the protruded shaft 33 can be used as a shaft for supporting rotation bodies or the like. Further, the protruded shaft 33 can be used in various kinds of applications by appropriately changing the shape of the shaft as required.

Figure 7:
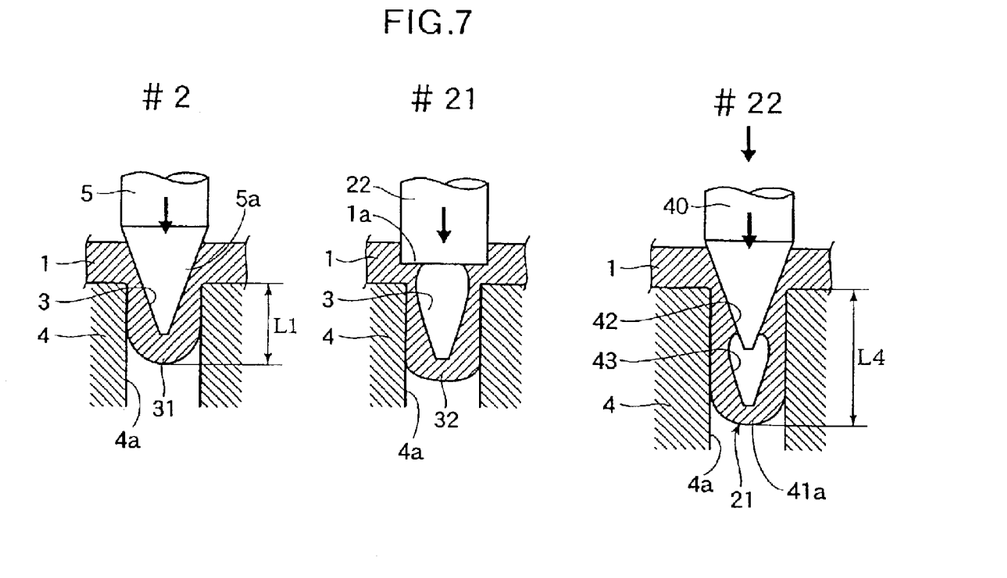
FIG. 7 is a step view which shows a still further method of forming a protruded shaft according to another embodiment of the present invention.

FIG. 7 shows further another method of forming a protruded shaft for an electronic memory device according to another embodiment of the present invention. First, as the first step #1 shown in FIG. 1, the base 1 made of a metal plate is positioned and placed on the upper surface of the die 4. Next, as the step #2 shown in FIG. 1, the taper-shaped pressing tool 5 is moved down concentrically with the hole 4a of the die 4 from one face side of the base 1 and pressed. Thus, a protrusion part 31 with a shaft length L1 is formed within the inside of the hole 4a of the die 4. As a result, a conical-shaped hollow part 3 that is similar as the taper part 5a of the pressing tool 5 is formed in the inside of the protruded part 31.

After that, in a pressing step #21 like the step #11, a flat pressing tool 22 with a flat face on the tip end is pressed down from the one face side of the base 1, which is placed on the die 4. By this pressing, a recessed part 1a that is shallower than the thickness of the base 1 is formed on one face side of the base 1. The wall material of the recessed part 1a is moved into the hole 4a of the die 4 so that the protruded part 31 is formed extended and the protruded part 32 with a still longer dimension is formed inside the hole 4a.

Next, in a protrusion shaft forming step #22, a taper-shaped extending tool 40 with the tip end shaped in a substantially conical shape is moved down concentrically with the hole 4a of the die 4 from one face side of the base 1. The extending tool 40 is fitted into the hollow part 3 from the recessed part 1a side to perform pressing and extending. By the pressing of the extending tool 40, the wall material moved into the hole 4a is further moved into the inside of the hole 4a deeper. Therefore, the protrusion part 32 is further extended in the hole 4a to form a protruded shaft 41 having a shaft length L4, which is relatively longer.

As a result, a hollow part 42 that is a substantially same shape as the extending tool 40 and a modified hollow part 43 at the tip side are formed inside of the protruded shaft 41. A closed bottom face part 41a is formed in the tip end of the protruded shaft 41.

The tip end of the protruded shaft 41 is closed as the above-mentioned embodiment and thus the interior formed between the base and the top cover can be kept airtight. Moreover, since the protruded shaft 41 is integrally formed in the base 1, a mechanical strength and accuracy required as an electronic memory device can be attained easily. The shaft length of the protruded shaft 41 is made relatively longer so that the protruded shaft 41 can be used as a shaft for supporting rotation bodies or the like. Further, the protruded shaft 41 can be utilized for various kinds of applications by appropriately changing the shape of the shaft as required. The features of this embodiment are similar to the embodiment shown in FIG. 6.

Embodiments of the present invention have been described above. However, the present invention is not limited to those embodiments described above, and many modifications can be made without departing from the subject matter of the present invention. For example, the protruded shaft may be formed in an approximately polygonal shape such as quadrangle or in an approximately elliptical shape. Further, the intermediate part or the tip part of the protruded shaft may be applied with an additional working to modify its shape depending on various applications.

As described above, in the method of forming a protruded shaft for an electronic memory device according to the present invention, the wall material of a base plate is moved into the hole of a die by the pressing of a pressing tool. Thus, a protruded shaft in which a hollow part is formed inside and the tip end is closed is formed simply, easily and inexpensively. Further, the tip end of the protruded shaft can be formed closed so that there may be no damage of air tightness for an electronic memory device due to the protruded shaft. The protruded shaft is integrally formed on the base and therefore can be formed with a required strength even when the base is a thin plate. As a result, it can be employed as a stopper pin, a shaft for supporting a head actuator, a positioning pin for a voice coil motor or the like in a HDD device, etc.

What is claimed is:

1. A method of forming a protruded shaft for an electronic memory device equipped with an approximately dish-shaped metal base on which a mechanism such as a head actuator or a drive motor for supporting and rotating an information storage medium is arranged and the base being provided with the protruded shaft for supporting or positioning the mechanism, and a top cover closing an aperture portion of the base to keep the interior formed between the base and the top cover in an airtight state, comprising the steps of:

pressing the metal base by a taper part of a taper-shaped pressing tool from one face side of the metal base placed on a die that is provided with a hole having a predetermined inner diameter;

moving wall material of the metal base into the hole of the die by the pressing step;

forming a protruded part having a hollow part inside and a closed tip by the pressing step;

next, pressing the protruded part with a second flat pressing tool having a diameter greater than an inside diameter of the hollow part at the one face side of the metal base to form a recessed part on the one face side of the base and further moving the wall material into the hole of the die in order to extend the protruded part, a tip face of the second flat pressing tool being formed in a flat or an approximately spherical shape; and next, pressing the protruded part by an extending tool to further move the wall material into the hole of the die for further extending the protruded part to form the protruded shaft;

wherein said closed tip of said metal base is airtight.

2. A method of forming a protruded shaft on a generally dish-shaped metal base of an electronic memory device comprising said base and said protruded shaft, a mechanism provided on said protruded shaft for supporting and rotating an information storage medium, a top cover and a seal for providing an airtight seal between said metal base and said top cover, said method comprising the steps of:

placing a first side of said metal base on a die that is provided with a hole having a predetermined inner diameter;

locating a pressing tool including a circular step part spaced from a tip end on a second side of said metal base in alignment with the hole of said die; and forcing the pressing tool against a face at the second side of the metal base to move wall material of the metal base into the hole of the die to form the protruded shaft with a closed tip and a hollow closed bore hole, wherein the step of forcing the pressing tool against the face at the second side of the metal base forms a circular opening at the second side of the metal base with a diameter greater than the diameter of an adjacent part of the bore hole and extending inwardly to form a step, wherein the metal base is free from an opening therein to be sealed.

3. A method of forming a protruded shaft for an electronic memory device equipped with an approximately dish-shaped metal base en which a mechanism such as a head actuator or a drive motor for supporting and rotating an information storage medium is arranged and the base being provided with the protruded shaft for supporting or positioning the mechanism, and a top cover closing an aperture portion of the base to keep the interior formed between the base and the top cover in an airtight state, comprising the steps of:

pressing the metal base by a taper-shaped pressing tool from one face side of the metal base placed on a die that is provided with a hole having a predetermined inner dimension, the pressing tool including a step part formed by setting an outer dimension of a base end of a taper part smaller than the outer dimension of the step part of the pressing tool, the taper part having a diameter tapering off to a tip end;

moving wall material of the metal base into the hole of the die with the taper part and the step part of the taper-shaped pressing tool, an inner dimension of the hole being substantially equal to the outer dimension of the protruded shaft; and forming the protruded shaft with a hollow part inside and a closed tip by the pressing step, wherein the closed tip of the metal base is airtight.

* * * * *